United States Patent [19]

Hunt et al.

[11] Patent Number: 5,003,254

[45] Date of Patent: Mar. 26, 1991

[54] MULTI-AXIS UNIVERSAL CIRCUIT BOARD TEST FIXTURE

[75] Inventors: Bill Hunt, Snohomish; Mahesh Parshotam, Edmonds, both of Wash.

[73] Assignee: Huntron, Inc., Mill Creek, Wash.

[21] Appl. No.: 430,873

[22] Filed: Nov. 2, 1989

[51] Int. Cl.$^5$ .................. G01R 31/02; B25B 1/20
[52] U.S. Cl. ............................ 324/158 F; 269/903
[58] Field of Search ............ 324/158 F, 158 P, 72.5; 269/110, 114, 203, 229, 256, 903

[56] References Cited

U.S. PATENT DOCUMENTS

| | | | |
|---|---|---|---|
| 357,387 | 2/1887 | Houston | 269/110 |
| 3,826,483 | 7/1974 | Siegel | 269/903 |
| 4,362,991 | 12/1982 | Carbine | 324/158 F |
| 4,471,298 | 9/1984 | Frohlich | 324/158 P |
| 4,527,119 | 7/1985 | Rogers et al. | 324/158 F |

Primary Examiner—Ernest F. Karlsen
Attorney, Agent, or Firm—Graybeal, Jensen & Puntigam

[57] ABSTRACT

A test fixture (10) which includes a base portion (12) and upstanding successive side walls (16, 17, and 18) integral with the base portion (12). Lateral grooves (22, 24, 26) extend around the inner surface of the three side walls (16, 17, and 18). A first movable clamp 30 is positioned between opposing side walls 16 and 18 and is movable in a selected slot (22, 24, 26) toward and away from the intermediate side wall 17. A second movable clamp (80) is mounted on and movable along the first clamp 30 and extends a small distance in the direction of the intermediate side wall (17). A circuit board (90) to be tested is typically clamped between the side walls (16 and 17) and the first and second clamps (30 and 80). A test probe (130) is positioned in a holder (91) which is mounted for movement between the first and third side walls (16 and 18) and toward and away from the second intermediate side wall (17). The position of the probe holder (91) relative to the board (90) is recognized by an optics system (142).

12 Claims, 3 Drawing Sheets

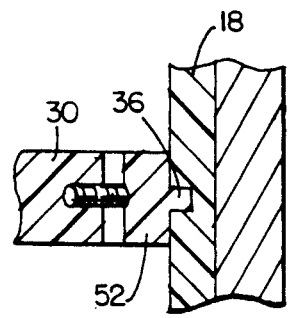
FIG.3
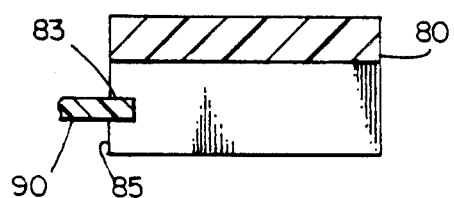
FIG.4
FIG.5
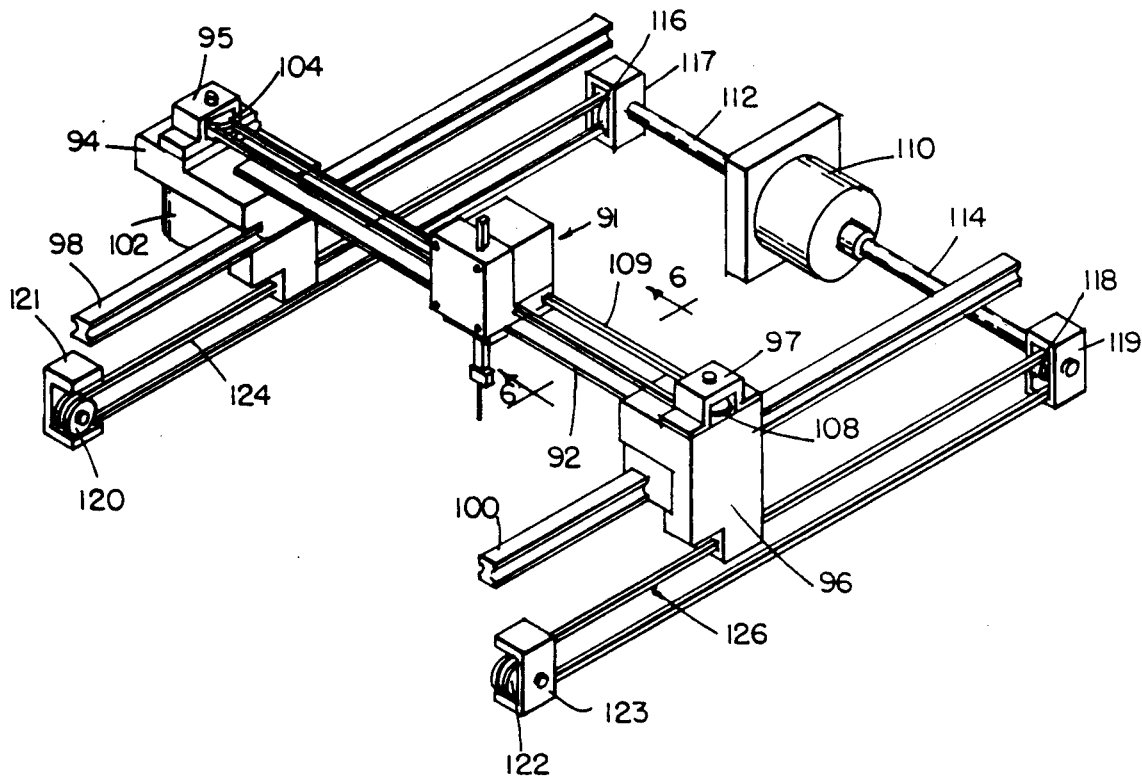

MULTI-AXIS UNIVERSAL CIRCUIT BOARD TEST FIXTURE

TECHNICAL FIELD

The present invention relates to mounting apparatus, i.e. a fixture, for the testing of electronic circuits and more particularly electronic circuits on circuit boards.

BACKGROUND OF THE INVENTION

In the testing of electronic components and circuits, a test probe is typically used to make contact with the circuit element being tested. The test probe is typically connected to the test apparatus itself by means of a test lead. The test probe may be positioned manually by an operator or it may be positioned and then repositioned automatically in a specific, controlled sequence, such as occurs in automatic test equipment (ATE) apparatus, which is designed to test complete circuit boards in a short period of time.

The circuit board being tested must be supported on a test bench or in a fixture of some kind. Occasionally, such fixtures will also include a means for controlling the movement of the test probe or probes. In a typical ATE, a computer program will control the movement of the test probe or probes. One known configuration includes a set of probes which are lowered to touch all of the test points on the circuit board, referred to generally as a "bed of nails" approach. However, such existing test fixtures are unsatisfactory in many applications; they are often difficult to use and they are expensive. Most existing test fixtures, particularly those which are less expensive, do not have the capability of reliably and repeatedly clamping the circuit boards for testing within required tolerances for automatic testing. Thus, a significant need remains for a test fixture which is simple to use and relatively inexpensive, but which provides reliable and repeatable positioning of printed circuit boards and the like within the required tolerances for subsequent circuit test procedures.

DISCLOSURE OF THE INVENTION

Accordingly, the present invention is a test fixture for testing electronic circuit boards which contain a plurality of circuit elements, and includes a base member which has a upstanding wall around three successive sides, thereby defining three successive wall portions. The first and third wall portions are parallel and at right angles to the intermediate second wall portion. Each wall portion includes a first holding element, such as a groove, which is adapted to receive the edge of a circuit board. The test fixture includes a first clamp member which extends between the first and third wall portions and which is supported so as to be movable toward and away from the second wall portion, wherein the first clamp member includes a second holding element which is in the same plane as the first holding elements in the first and third wall portions, and also is adapted to receive an edge of a circuit board. Also included is a second clamp member which is supported by and movable along said first clamp member, extending at least a portion of the distance between the first clamp member and the second wall portion. The second clamp member includes a third holding element which is in the same plane as the first and second holding elements and is also adapted to receive an edge of a circuit board. The fixture also includes means for movably positioning a test probe relative to the circuit board to be tested.

DESCRIPTION OF THE DRAWINGS

FIG. 3 is a cross-sectional view taken along lines 3—3 in FIG. 2.

FIG. 4 is a cross-sectional view taken along lines 4—4 in FIG. 2.

FIG. 5 is a perspective view showing in detail the means for controlling the position of the test probe relative to the test fixture.

BEST MODE FOR CARRYING OUT THE INVENTION

Figure 1:
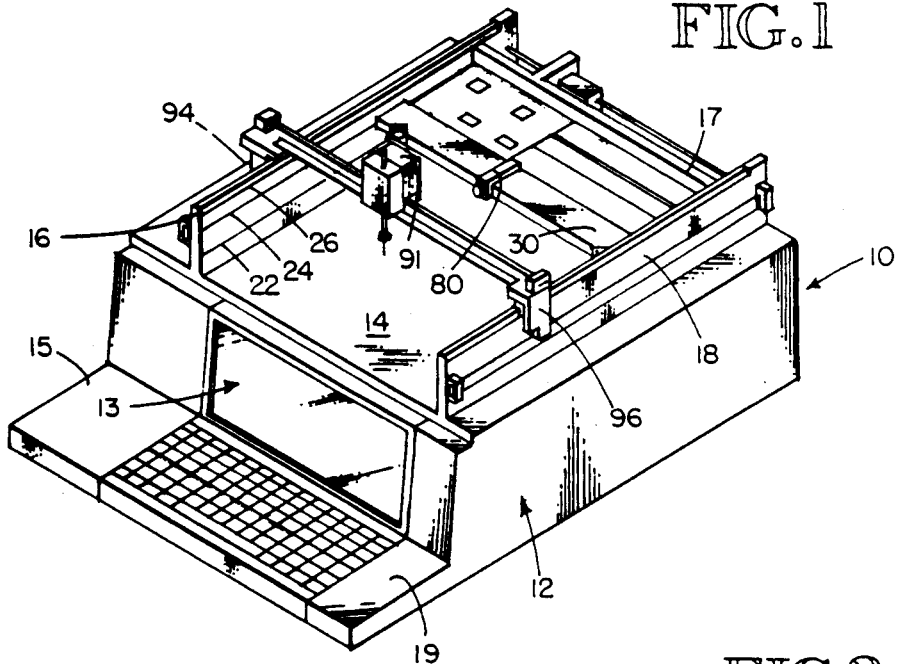
FIG. 1 is a perspective view of the test fixture of the present invention.
Figure 2:
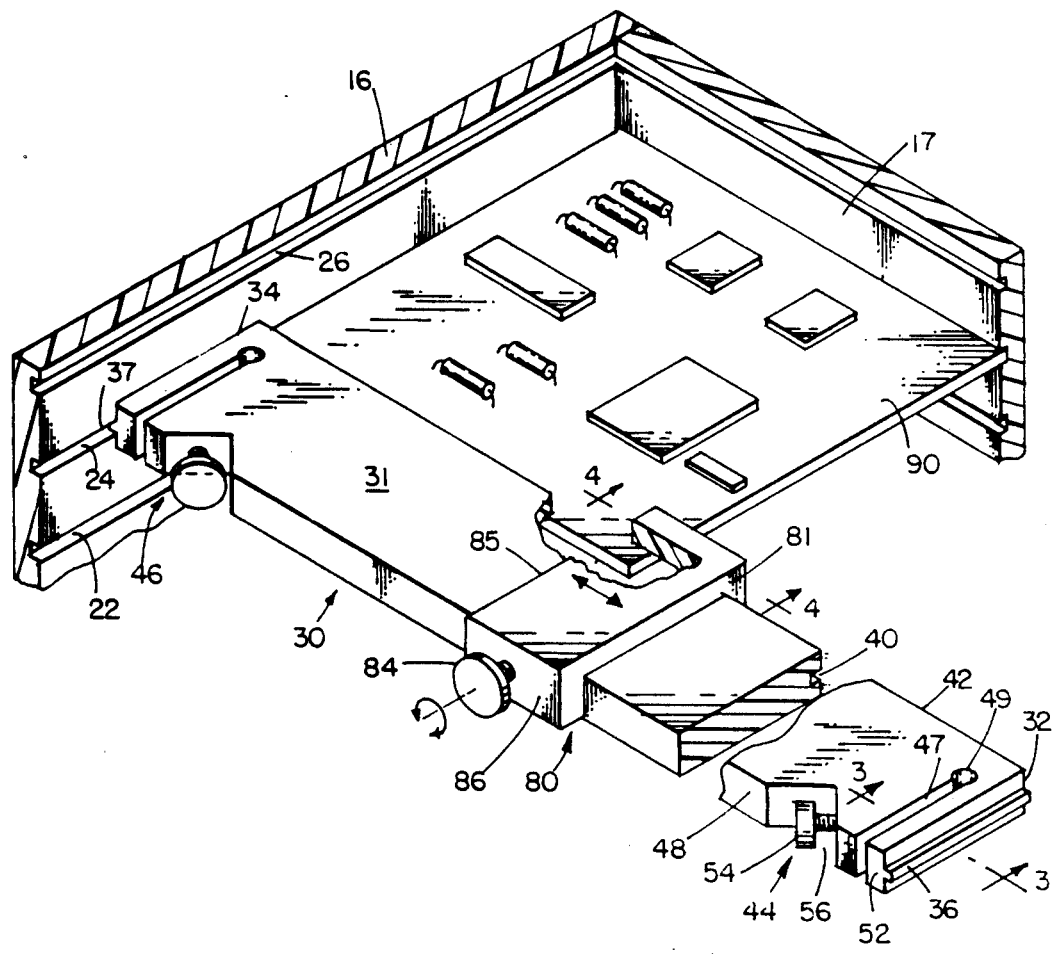
FIG. 2 is a perspective view, partially cutaway, of a portion of the test fixture shown in FIG. 1.

FIGS. 1 and 2 show the preferred embodiment of the test fixture of the present invention. The fixture, which is shown generally at 10, includes a base portion 12. The base portion 12 is approximately square in outline, approximately 22 inches on a side and 7 inches high, and has a flat top surface 14, although these dimensions could vary. The base portion 12 includes an opening 13 at the front which extends to the rear end thereof, to accommodate a test instrument or the like (not shown). Facing elements 15 and 19 will typically be used so that the remaining portions of the front of the base portion 12 match the configuration of the test instrument which extends outwardly from the base portion 12.

Positioned around three successive sides of the base portion 12 are side walls 16, 17 and 18, which extend upwardly from the top surface 14 of the base portion 12. The remaining side (the front side in FIG. 1) is open. Side walls 16–18 in the embodiment shown are approximately 3½ inches high and ⅜ inch thick, and are integral with the base portion 12. In the embodiment shown, the walls 16–18 are each located a short distance in from the sides and back of the base portion, thereby defining narrow shelf-like sections along the sides and back of the base portion.

Cut into the interior surfaces of each of the side walls 16–18 are three lateral slots 22, 24 and 26. Each slot, i.e. slot 24, extends for the full length of each side wall and is continuous around the inner surfaces of the three side walls 16–18, which are lined with an electrically non-conductive material such as Delrin. The slots 22, 24 and 26 are parallel with each other and the top surface 14 of base portion 12. The slots are located at selected locations vertically in order to provide different clearances for the various circuit boards to be tested relative to the test probe. It is not necessary, however, that the test fixture have more than one slot. Also, alternatives to slots could be used, such as support tabs or individual holding elements which extend from the walls. The purpose of the groove or other holding element is to firmly and reliably hold the edge of the circuit board, providing a reference position for the board.

Extending between opposing side walls 16 and 18 is a first movable circuit board clamp 30. In the embodiment shown, the movable board clamp 30 is made from a plastic composite, such as Delrin or fiberglass, and is approximately 19 inches long, 2—2½ inches wide and ½ inch thick. At the opposing ends 32 and 34 of clamp 30 are elongated ridges 36 and 37 which extend along each end 32 and 34 and are adapted to fit into one of the three slots 22, 24 and 26, to permit controlled slidable movement of the clamp 30 therealong, toward and away from side wall 17.

The clamp 30 includes a slot 40 in the inner side edge 42. Slot 40 extends for the full length of clamp 30, opening onto each end 32, 34 and is located such that it is coplanar with the particular slot 22, 24 or 26 in which end ridges 36 and 37 are positioned. Slot 40 has a similar configuration to that of slots 22, 24 and 26. Of course, tabs or other holding elements could be used as an alternative to slot 40. Board clamp 30 is capable of being locked into position at any point along side walls 16 and 18. This is accomplished by first and second locking assemblies shown generally at 44 and 46, in the vicinity of each end of clamp 30. Locking assembly 44, for example, includes a lateral slot 47 located close to end 32 of clamp 30. Slot 47 extends from the outer side edge 48 of the clamp to a point which is close to the inner side edge 42. The slot 47 terminates in a rounded end portion 49 which is slightly larger in diameter than the width of the slot. The location of slot 47 relative to the clamp 30 itself in combination with the material comprising the clamp 30 permits a slight endwise movement of the partially free end section 52 of the clamp 30 created by the slot 47. Thus, the portion of the clamp 30 between the rounded end 49 of the slot 47 and the inner side edge 42 acts like a rigid hinge to some extent.

A threaded tightening bolt 54 is threaded through a portion of the board clamp 30 from outer side edge 48 so that the forward end of tightening bolt 54 abuts against section 52, forcing it away from the board clamp 30 and against the side wall 16 when the bolt is turned clockwise, resulting in the tightening of that end of the board clamp. The tightening knob is located at an angle of approximately 45° relative to side edge 48, within a triangular cutout section 56 which extends inwardly of clamp 30 from side edge 48. Turning bolt 54 in one direction forces section 52 outwardly, while turning bolt 54 in the other direction permits section 52 to rebound to its original position due to the resilient nature of the material comprising the board clamp 30. Locking assembly 46 is identical to locking assembly 44, but of course is adapted for clamp end 34. The locking assemblies 44 and 46 provide a convenient capability to quickly and easily tighten and release the board clamp 30.

Figure 7:
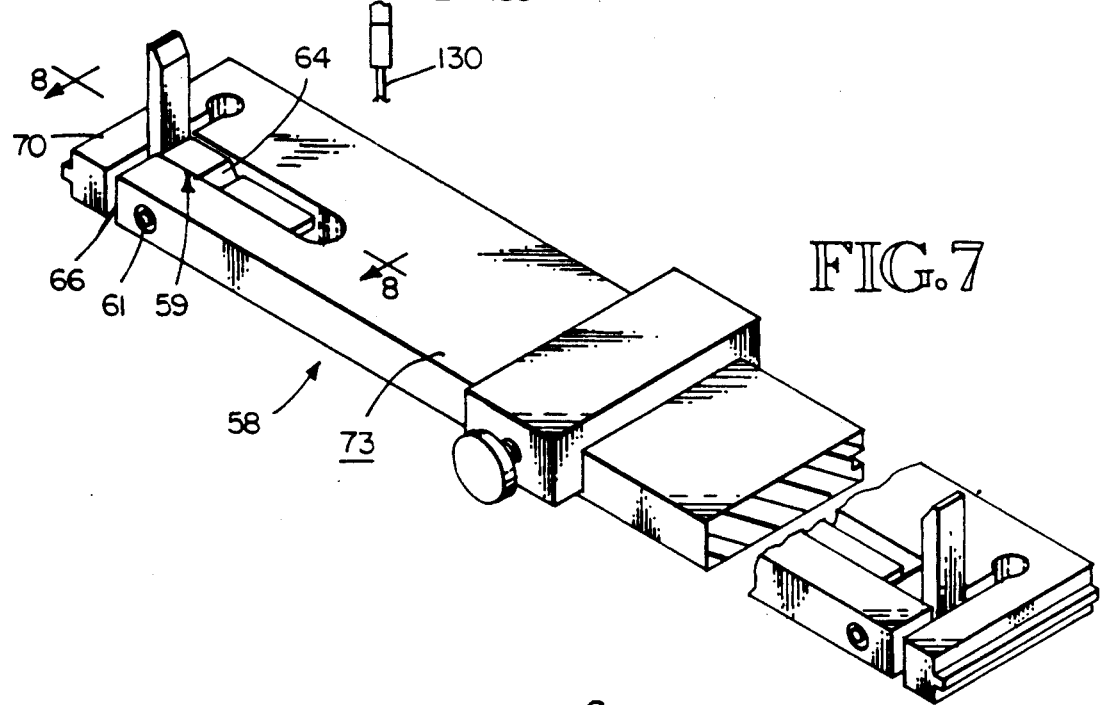
FIG. 7 is a perspective view of an alternative embodiment of the portion of the test fixture shown in FIG. 2.
Figure 8:
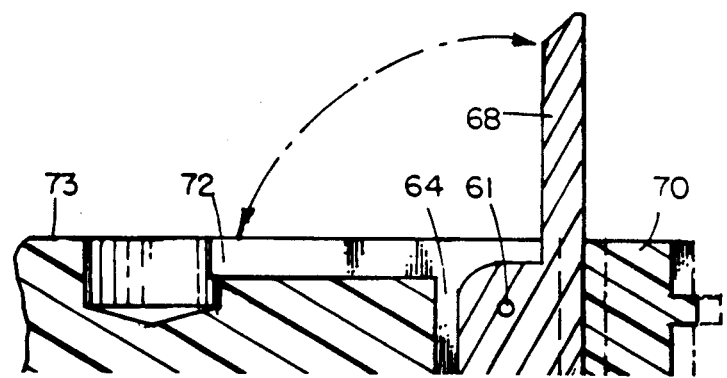
FIG. 8 is a cross-sectional view taken along lines 8—8 in FIG. 7.

An alternative embodiment to board clamp 30 is shown in FIGS. 7 and 8. FIGS. 7 and 8 show a movable board clamp 58 which is generally similar to clamp 30 shown in FIG. 2, except for the tightening element portion of each locking assembly. The tightening element 59, which is generally in the form of a swiveling knob instead of a bolt, includes a base portion 60 which is mounted so as to pivot or swivel about horizontal pin 61 in the longitudinal plane of the board clamp 58, as shown most clearly in FIG. 8.

The base portion 60 is positioned in a cutout portion 64 of the clamp, which opens onto a slot 66, which is similar to slot 47 in the embodiment of FIG. 2 and defines a narrow, slightly pivoting, end section 70. Extending from the base portion 60 is an arm 68. The base portion 60 is so configured and mounted relative to end section 70 that when the arm 68 extends vertically, end section 70 is in a relaxed, at rest, state. In this position, the board is "unlocked." When arm 68 is moved clockwise 90° so that it is horizontal, fitting into opening 72 in surface 73 of board clamp 58, a portion 74 of the surface of base portion 60 moves against end section 70, forcing it outwardly against the side wall 16 of the fixture. The movement of end portion 70 is sufficient to provide a secure tightening of the clamp against the side wall. The surface portion 74 of base 60 is curved so as to give a smooth, gradual outward movement of end section 70 and to provide a smooth locking effect. When it is desired to "unlock" the board being tested, the arm 68 of tightening element 59 is simply rotated away from the opening 72, thereby permitting end section 70 of the clamp to move away from the side wall 16, back to its original at rest position. The corresponding locking element at the other end of clamp 58 is similar in structure and is operated similarly.

FIG. 2 also shows a second movable board clamp 80 which is adapted to be mounted on and move longitudinally along the first board clamp 30. The second movable board clamp 80 is generally in the shape of a shallow "U", approximately 3½ inches long, 1¼ inches wide, and 1 inch high. The inner surfaces of board clamp 80 abut the upper surface 31 of clamp 30 as well as the inner and outer side edges 42 and 48 thereof. The board clamp 80 includes an inwardly projecting ridge (not shown) along the inner surface extending between end edges 81 and 85, the ridge mating with the slot 40 in board clamp 30. Clamp 80 also includes a slot 83 in edge 85, as shown in FIG. 4, which when the clamp 80 is positioned as shown on clamp 30, forms a right angle continuation of slot 40 in clamp 30, to receive the circuit board 90 to be clamped. A tightening bolt 84 is provided in the front end edge 86 of board clamp 80. When turned in the clockwise direction, the tightening bolt threads through the board clamp 80 and bears against the outer side edge 48 of board clamp 30. This locks board clamp 80 into position on board clamp 30.

Referring to FIG. 2, in order to position a circuit board in the test fixture, board clamp 80 is loosened and moved toward side wall 18. Board clamp 30 is then loosened and moved away from intermediate side wall 17 a sufficient distance to accommodate the circuit board 90 which is to be tested. The edge of the circuit board 90 is then positioned in one of the slots 22, 24 or 26 in the side walls, typically in side walls 16 and 17, such that the circuit board 90 is firmly fitted into the corner of the fixture 10 which is formed by adjacent side walls 16 and 17.

Board clamp 30 is then moved toward side wall 17 and the edge of the board 90 is fitted into the slot 40 of clamp 30. Some pressure is applied to insure a secure positioning of the circuit board 90. Board clamp 30 is then locked as described above.

Board clamp 80 is then moved toward the circuit board 90, i.e. toward side wall 16, until the edge of the board 90 fits into slot 83 in edge 85 of board clamp 30, at which point the second board clamp 80 is locked, as described above. The circuit board 90 is now locked reliably and securely in place in the fixture, within the required position tolerances relative to the test probe, as described more in detail hereinafter. Two edges of the circuit board 90 are held by adjacent side walls 16 and 17, while a third edge is held by board clamp 30. A portion of the remaining edge of the circuit board, including the corner which is defined by clamps 30 and 80, is held by clamp 80.

FIG. 5 shows the structure by which the position of a test probe is controlled relative to the circuit board which has been fixed in position as described above. The test probe is positioned in a probe holder shown generally at 91 in FIG. 5. The rest of probe holder 91 will be discussed in more detail in following paragraphs with respect to FIG. 6. The test probe holder 91 is mounted for movement laterally across the test fixture 10, i.e. between side walls 16 and 18 thereof. The probe holder 91 is slideably mounted on a lateral mounting rod 92 which extends between two side pulley mounts 94 and 96, on which are mounted pulley blocks 95 and 97. The pulley mounts 94, 96 are in turn each mounted for slideable movement along longitudinal mounting rods 98 and 100 which extend along the outside of side walls 16 and 18, respectively. The combination of lateral mounting rod 92, side mounts 94 and 96, and longitudinal mounting rods 98 and 100 provides a capability by which probe holder 91 is able to be located at any point within the area between side walls 16-18.

The system for controllably moving the probe holder 91 along mounting rod 92 and for moving the side pulley mounts 94 and 96 along mountings rods 98 and 100 is also shown in FIG. 5. This structure is arranged so as to provide close tolerances for positioning of the test probe, on the order of 4/1000s inch. The apparatus for moving the probe holder 91 laterally between the side walls 16 and 18 includes a motor 102 which is mounted on side pulley mount 94. Motor 102 drives a first pulley 104 which is mounted on the drive shaft of the motor in pulley block 95. The motor is oriented such that the pulley 104 rotates in the horizontal plane. A second pulley 108 is mounted on side mount 96 in pulley block 97. Pulley 108 is mounted for horizontal rotation and is coplanar with pulley 104. A flexible belt or cord 109, referred to as a timing belt, extends between the two pulleys 104 and 108. The movement of motor 102 rotates pulley 104, which moves belt 109. Belt 109 is in the form of a narrow, elongated loop, on one point of which is fixedly attached the probe holder 91. The remainder of the belt slides freely through the probe holder. As a result, movement of the belt 109, caused by the action of motor 102, will result in a corresponding controlled movement of the probe holder 91 and hence the probe positioned therein. The motor 102 is a reversible stepper motor so that very accurate control over successive movements of the probe holder is possible with programmed instructions.

A similar structure is provided for movement of the side pulley mounts 94 and 96 toward and away from side wall 17. A reversible stepper motor 110 is mounted to the rear of side wall 17. Drive shafts 112 and 114 extend from the motor 110 and drive pulleys 116 and 118, both of which are mounted for rotation in the vertical plane in pulley blocks 117 and 119, respectively, located at the rear end of side walls 16 and 18. Two additional pulleys 120 and 122, respectively, are mounted in pulley blocks 121 and 123 in the same plane as pulleys 116 and 118, at the front end of side walls 16 and 18. Extending between pulleys 116 and 120 and pulleys 118 and 122, respectively, are timing belts 124 and 126, both in the form of narrow loops. Side pulley mount 96 is fixedly mounted to one point of belt 126 and side pulley mount 94 is fixedly mounted to one point of belt 124, such that movement of the belts, by action of motor 110, will cause movement of the side pulley mounts, and hence the test probe, toward and away from side wall 117. Although the embodiment described uses flexible drive belts, it should be understood that other conventional drive elements could be used, such as, for instance, lead screws.

Figure 6:
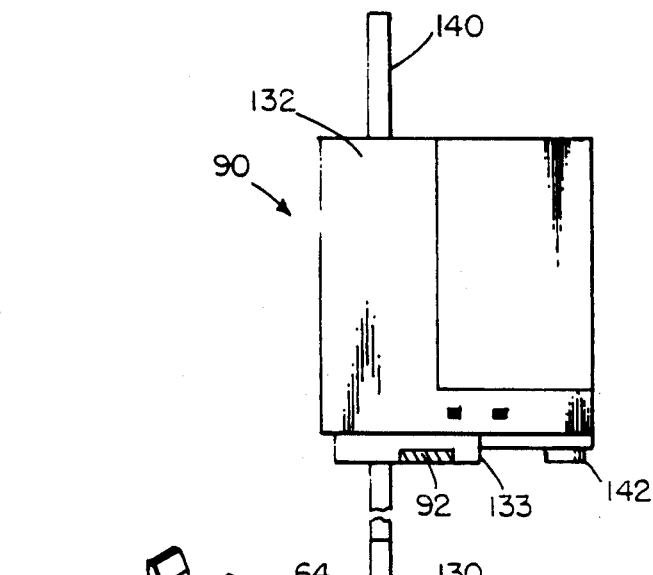
FIG. 6 is a side elevational view showing the test probe holder member of the present invention.

FIG. 6 shows a cross-sectional view of the probe holder 90. A standard electrical spring-loaded test probe 130 is mounted in a housing element shown generally at 132. The housing is supported by a platform 133 which in turn is supported on mounting rail 92 so that the housing moves therealong by action of the belt 109 and motor 102, as described above. Probe 130 may be moved vertically by the rail member 140 to which the probe 130 is secured. This may be by hand or under automatic Z-axis control. Electrical connections (not shown) extend from the probe to a test instrument. The position of the probe relative to the board is determined and controlled by a miniature camera 142, which includes a lens adapter for such operation. Additional light may be provided by a small light source (not shown) located on the holder 90. Accurate control of the probe is provided through use of the image provided by the camera.

In operation, a circuit board to be tested is first positioned in the test fixture as described above. The probe 130 will then begin movement, under software control, to contact selected test points on the board. The actual test of the element at the test point will then occur and the test data will be compared with a previously stored standard value for that test point. When an out-of-tolerance condition is determined at any test point, a fault condition is indicated.

Hence, a test fixture has been described for reliably and accurately positioning a circuit board for testing, as well as a device for accurately controlling the movement of the probe relative to that board. Programmed instructions control the movement of the test probe relative to the board, such that an entire board may be tested point-by-point automatically, with the test results at each point being compared with a known standard to determine whether or not a board is operating properly.

Although a preferred embodiment of the invention has been disclosed herein for illustration, it should be understood that various changes, modifications, and substitutions may be incorporated in such embodiment without departing from the spirit of the invention as defined by the claims which follows.

We claim:

1. A test fixture apparatus for testing the operation of a circuit board containing a number of circuit elements, comprising:

a supporting base member having an upstanding wall around three successive sides thereof extending from the upper surface thereof, thereby defining three successive wall portions which are fixed in relation to each other, the first and third wall portions being parallel and at right angles to the second intermediate wall portion, including circuit board holding elements at the interior surface of the three wall portions adapted to receive the edge of a circuit board therein;

a first clamp member extending between the first and third wall portions and movable toward and away from the second wall portion, wherein said first clamp member has a surface having circuit board holding elements in the same plane as the holding elements in the first and second wall portions and wherein said first clamp member is elongated with opposing ends and includes means at said opposing ends for mating with receiving means on the interior surfaces of both the first and third wall portions for support of said first clamp member and to permit controlled movement of said first clamp member toward and away from the second wall portion, said first clamp member further including means cooperating with said mating means for selectively locking said first clamp member in place; and means, supported by said upstanding wall, for movably positioning a test probe relative to the circuit board to be tested.

2. An apparatus of claim 1, wherein the circuit board holding elements in the three wall portions comprise a continuous groove therein and the circuit board holding element in the first clamp member comprises a continuous groove and wherein said receiving means on the interior surfaces of said first and third wall portions is also said continuous groove, said mating means on the opposing ends of said first clamp member comprising projections which extend outwardly from said opposing ends, engaging said continuous groove.

3. An apparatus of claim 2, including a second clamp member supported by and movable along said first clamp member, extending at least a portion of the distance between the first clamp member and the second wall portion, said second clamp member including a groove in one surface thereof in the same plane as the grooves in the first end second wall portions and said first clamp member.

4. An apparatus of claim 1, wherein the three wall portions are relatively thin and are integral with the base member.

5. An apparatus of claim 1, wherein the base member includes an opening therein to receive a circuit test instrument.

6. An apparatus of claim 2, wherein the first clamp member includes means supporting said first clamp member at each end thereof in said continuous groove and further includes means for locking the first clamp member in place between said first and third wall portions.

7. An apparatus of claim 2, wherein said locking means includes a lateral slot in the first clamp member near the respective opposing ends thereof, defining two end portions which are movable a small distance endwise of the first clamp member, and means tending to force the two end portions outwardly away from the remainder of the first clamp member against the first and third wall portions, thereby firmly fixing the first clamp member in place.

8. An apparatus of claim 3, wherein said second clamp member extends only a short distance away from the first clamp member toward the second wall portion, and wherein said second clamp member includes means for locking the second clamp member to the first clamp member, and wherein the continuous groove in the first and second wall portions and the grooves in the first and second clamp members are such that substantially all of three edges and a portion of a fourth edge of a circuit board are received therein.

9. An apparatus of claim 1, including a probe holder for holding a test probe, and means for supporting the probe holder and for moving the probe holder between said first and third wall portions.

10. An apparatus of claim 9, including optical means for providing an image of the position of the test probe relative to the circuit board to be tested and for storing that image, and further including means for moving the test probe within the test holder in accordance with the stored image so as to contact desired test points on the circuit board to be tested.

11. An apparatus of claim 9, wherein the moving means includes first and second side mounts mounted in the vicinity of the first and third wall portions, and a first mounting rail which extends between the first and second side mounts and is configured to mate with a portion of the probe holder for slideable movement of the probe holder therealong, the apparatus further including second and third mounting rails mounted along first and third wall portions, the side mounts mating with the second and third rails to permit the side mounts to move therealong, toward and away from the second wall portion.

12. An apparatus of claim 11, wherein said means for moving the probe holder includes a first reversible stepper motor, a first drive belt extending between a first set of pulleys which are mounted, respectively, on the first and second side mounts, said first motor being drivingly connected to one of said first set of pulleys and said probe being connected to said first drive belt, and wherein said means for moving the probe holder further includes a second reversible stepper motor, second and third drive belts extending between, respectively, second and third sets of pulleys mounted along the first and third wall portions, and means drivingly connecting said second stepper motor and said second and third drive belts, wherein said first and second side mounts are connected to the second and third drive belts such that movement of the second and third drive belts, controlled by said second motor, results in controlled movement of said side mounts and hence said probe holder toward and away from said second wall portion.

* * * * *